United States Patent
Lee

(10) Patent No.: US 10,254,592 B2
(45) Date of Patent: Apr. 9, 2019

(54) LIQUID-CRYSTAL DISPLAY DEVICE AND METHOD OF FABRICATING THE SAME

(71) Applicant: Samsung Display Co. Ltd., Yongin-si (KR)

(72) Inventor: Sang Hun Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/191,726

(22) Filed: Jun. 24, 2016

(65) Prior Publication Data

US 2017/0082885 A1   Mar. 23, 2017

(30) Foreign Application Priority Data

Sep. 22, 2015  (KR) .......................... 10-2015-0133521

(51) Int. Cl.
| | | |
|---|---|---|
| *G02F 1/1339* | (2006.01) | |
| *G02F 1/1335* | (2006.01) | |
| *G02F 1/1341* | (2006.01) | |
| *H01L 27/12* | (2006.01) | |
| *G02F 1/1333* | (2006.01) | |
| *G02F 1/1362* | (2006.01) | |

(52) U.S. Cl.
CPC ........ *G02F 1/13394* (2013.01); *G02F 1/1341* (2013.01); *G02F 1/133512* (2013.01); *G02F 2001/133388* (2013.01); *G02F 2001/136222* (2013.01); *G02F 2202/02* (2013.01); *H01L 27/1248* (2013.01); *H01L 27/1259* (2013.01)

(58) Field of Classification Search
CPC ............... G02F 1/1339; G02F 1/13394; G02F 1/133512; G02F 2001/133388; G02F 2001/13396

See application file for complete search history.

(56) References Cited

U.S. PATENT DOCUMENTS

| | | | |
|---|---|---|---|
| 6,249,333 B1 * | 6/2001 | Zhang | G02F 1/1339 257/72 |
| 7,952,678 B2 * | 5/2011 | Chan et al. | |
| 8,382,545 B2 * | 2/2013 | Sakakura | H01L 51/5237 445/23 |
| 2008/0129946 A1 * | 6/2008 | Chan | G02F 1/1339 349/153 |
| 2016/0231617 A1 * | 8/2016 | Hong | G02F 1/133514 |
| 2016/0246106 A1 * | 8/2016 | Ma | G02F 1/1339 |

* cited by examiner

*Primary Examiner* — Dung T Nguyen
(74) *Attorney, Agent, or Firm* — Cantor Colburn LLP

(57) ABSTRACT

A liquid-crystal display device includes: a first substrate; a second substrate disposed opposite to the first substrate, where a display area and a non-display area are defined in each of the first and second substrates, a liquid-crystal layer disposed between the first substrate and the second substrate, an organic layer including a protruding portion disposed in the non-display area of the first substrate, and a light-blocking pattern disposed on the organic layer and comprising a step protruding therefrom, where the step overlaps the protruding portion.

14 Claims, 23 Drawing Sheets

LIQUID-CRYSTAL DISPLAY DEVICE AND METHOD OF FABRICATING THE SAME

This application claims priority to Korean Patent Application No. 10-2015-0133521, filed on Sep. 22, 2015, and all the benefits accruing therefrom under 35 U.S.C. § 119, the content of which in its entirety is herein incorporated by reference.

BACKGROUND

1. Field

The disclosure relates to a liquid-crystal display ("LCD") device and a method of fabricating the LCD.

2. Description of the Related Art

Typically, a liquid-crystal display ("LCD") device includes an array substrate, an opposing substrate facing the array substrate, and a liquid-crystal layer interposed between the array substrate and the opposing substrate. The LCD device may include a display area in which a plurality of pixels are disposed and images are displayed, and a non-display area surrounding the display area in which a driving circuit and the like are disposed.

Recently, an LCD device exhibiting a higher aperture ratio, e.g., an LCD that employs a color-filter on array ("COA") substrate where a color filter is provided on the array substrate, is under development. For an LCD device employing such a COA substrate, a misalignment may occur during the process of coupling the COA substrate with the opposing substrate on which a light-blocking member is formed. To prevent such a misalignment, a black matrix on array ("BOA") substrate where a light-blocking member is provided on the COA substrate has been developed. Moreover, a black column spacer ("BCS") is under development, in which a light-blocking pattern and a column spacer for maintaining a gap between the substrates are made of the same material during the same process.

SUMMARY

In a process of fabricating a liquid crystal display ("LCD") device having a black column spacer ("BCS") structure, a liquid-crystal layer is disposed on an array substrate, and then the array substrate may be coupled with an opposing substrate by placing the opposing substrate above the array substrate and pressing down the opposing substrate toward the array substrate. In such a process, the opposing substrate may be dented downwards by the pressure, such that the array substrate may adhere to the opposing substrate, especially in a non-display area. If the first substrate 100 adheres to the second substrate 200, liquid crystals may not properly spread out in the non-display area. As a result, an empty space in the liquid crystals may be seen by a viewer.

Aspects of the disclosure provide an LCD device having a structure for preventing an occurrence that liquid-crystal molecules do not properly spread out, and a method of fabricating the LCD device.

According to an exemplary embodiment of the disclosure, an LCD device includes a structure for preventing that an array substrate adheres to an opposing substrate when the array substrate is coupled with the opposing substrate, so that liquid-crystal molecules may spread out properly even to a non-display area.

According to an exemplary embodiment, an LCD device include: a first substrate; a second substrate disposed opposite to the first substrate, where display area and a non-display area are defined in each of the first and second substrates; a liquid-crystal layer disposed between the first substrate and the second substrate; an organic layer including a protruding portion disposed in the non-display area of the first substrate; and a light-blocking pattern disposed on the organic layer and including a step protruding therefrom, where the step overlaps the protruding portion.

According to another exemplary embodiment of the disclosure, there is provided a method of fabricating an LCD device having a structure for allowing liquid-crystal molecules to properly spread out.

According to an exemplary embodiment, a method of fabricating an LCD device includes: providing an organic layer including a protruding portion in a non-display area of a first substrate, where a display area and the non-display area are defined in the first substrate; and providing a light-blocking pattern including a step protruding therefrom on the organic layer, where the step overlaps the protruding portion.

It should be noted that effects of the disclosure are not limited to those described above and other effects of the disclosure will be apparent to those skilled in the art from the following descriptions.

BRIEF DESCRIPTION OF THE DRAWINGS

The above and other features of the invention will become more apparent by describing in detail exemplary embodiments thereof with reference to the attached drawings, in which.

DETAILED DESCRIPTION

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Hereinafter, exemplary embodiments of the disclosure will be described in detail with reference to the accompanying drawings.

Figure 1:
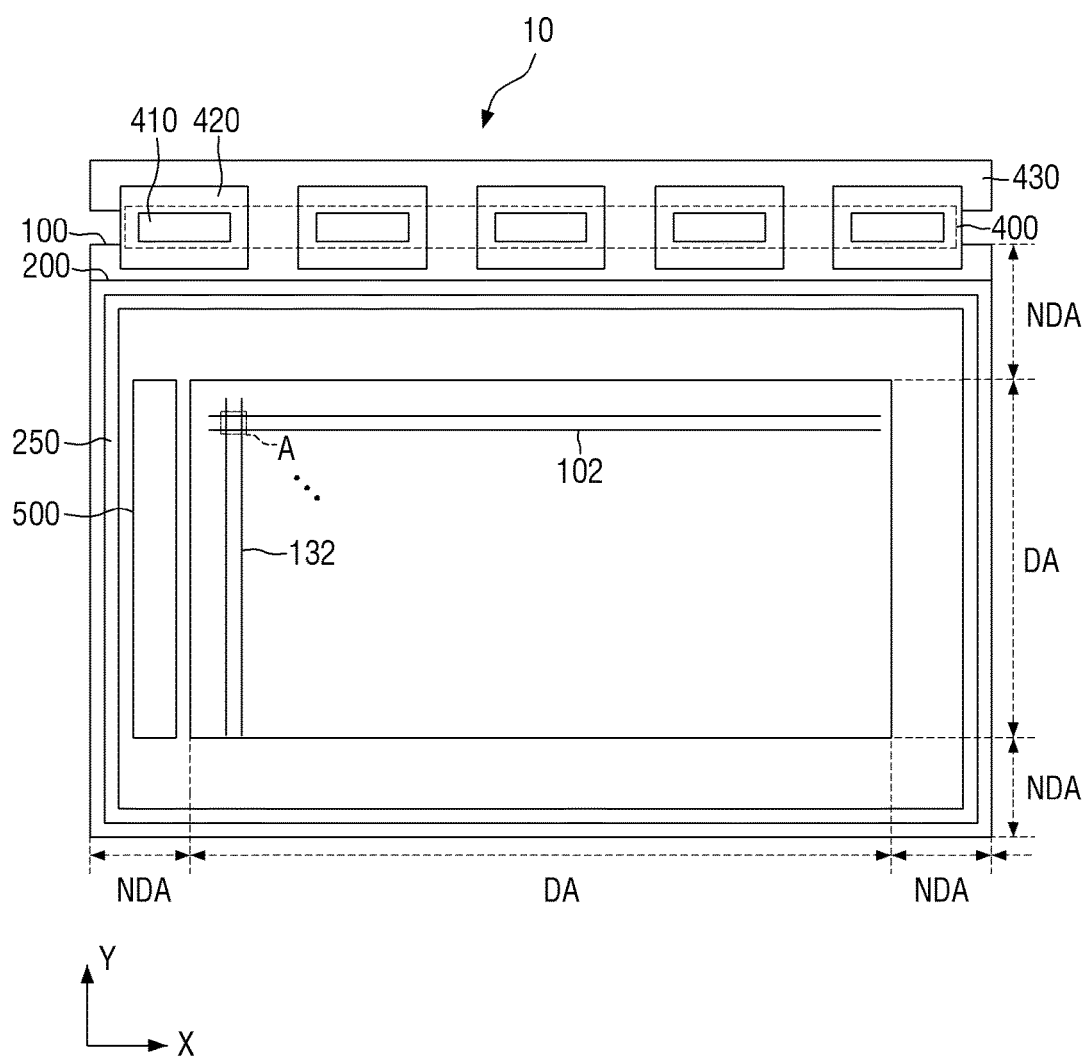
FIG. 1 is a schematic plan view of an LCD device according to an exemplary embodiment of the disclosure.
Figure 2:
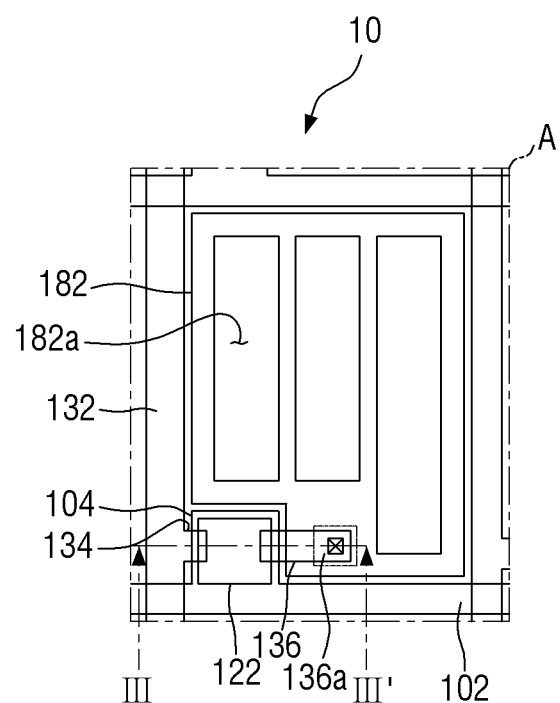
FIG. 2 is an enlarged view of area A of FIG. 1.
Figure 3:
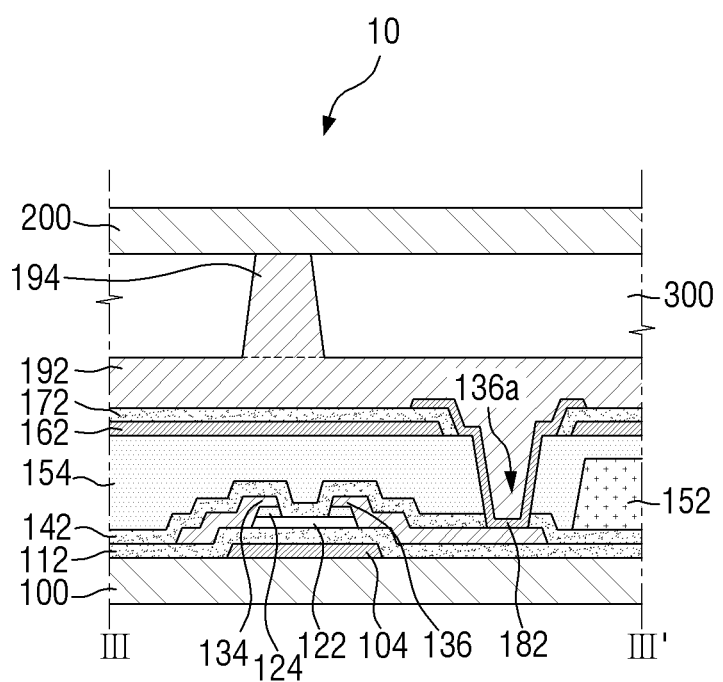
FIG. 3 is a cross-sectional view taken along line III-III' of FIG. 2.

FIG. 1 is a schematic plan view of an LCD device according to an exemplary embodiment of the disclosure. FIG. 2 is an enlarged view of area A of FIG. 1. FIG. 3 is a cross-sectional view taken along line III-III' of FIG. 2.

Referring to FIGS. 1 to 3, an exemplary embodiment of an LCD device 10 includes a first substrate 100, a second substrate 200 facing the first substrate 100, and a liquid-crystal layer 300 disposed between the first substrate 100 and the second substrate 200.

Each of the first substrate 100 and the second substrate 200 includes a display area DA and a non-display area NDA. A plurality of pixel areas arranged in a matrix form may be defined in the display area DA.

In the display area DA of the first substrate 100, a pixel electrode 182 may be disposed in every pixel area. The pixel electrode 182 may receive a data voltage via a thin-film transistor. The pixel electrode 182, along with a common electrode 162, may generate electric field to control orientations of liquid crystal molecules in a liquid-crystal layer 300 interposed therebetween.

A data driving unit 400 for applying a data driving signal and a gate driving unit 500 for applying a gate driving signal may be disposed at the outer periphery of the display area DA of the first substrate 100.

The data driving unit 400 may receive image signals and a data control signal from a timing controller (not shown). The data driving unit 400 may generate analog data voltages corresponding to the image signals in response to the data control signal. The data driving unit 400 may apply the data voltages to the pixels via data lines 132.

The data driving unit 400 may include a plurality of data driving chips 410. Each of the data driving chips 410 may be disposed or mounted on respective first flexible printed circuit boards and connected to a driving circuit board 430 and data pads (not shown) in the non-display area NDA. Although not shown in the drawings, each of the first flexible printed circuit boards 420, on which a corresponding data driving chip 410 is mounted, may be connected to the respective data pads via anisotropy conductive films.

The gate driving unit 500 may generate gate signals in response to a gate control signal applied from a timing controller (not shown) disposed or mounted on the driving circuit board 430. The gate signals may be applied to the pixels via gate lines 112 row by row in sequence. The gate driving unit 500 may be implemented, but is not limited to, as an amorphous silicon gate ("ASG") driver that is integrated with the non-display area NDA. In one exemplary embodiment, for example, the gate driving unit 500 may be mounted on the flexible printed circuit boards using the tape carrier package ("TCP") technique or the chip on glass ("COG") technique.

The first substrate 100 may be coupled with the second substrate 200 by a sealing member 250 including or made of sealant or the like. The sealing member 250 may be disposed in the non-display area NDA of each of the first substrate 100 and the second substrate 200.

In some embodiments, the sealing member 250 disposed in the non-display area NDA may have a quadrangular band shape as shown in FIG. 1. However, the shape of the sealing member 250 is not limited thereto, but may be implemented in a variety of shapes depending on the structure of LCD device.

The liquid-crystal layer 300 including liquid-crystal molecules having a positive or negative dielectric anisotropy may be interposed between the first substrate 100 and the second substrate 200.

Hereinafter, the structure of the first substrate 100 and the second substrate 200 of the LCD device 10 according to an exemplary embodiment will be described in detail.

The first substrate 100 and the second substrate 200 may include an insulative material such as transparent glass, quartz, ceramic, silicon or transparent plastic, one of which may be chosen appropriately by those skilled in the art.

A plurality of gate wirings 102 and 104 and a plurality of data wirings 132, 134 and 136 may be disposed on the first substrate 100.

The gate wirings 102 and 104 may include a plurality of gate lines 102 and a plurality of gate electrodes 104. The data wirings 132, 134 and 136 may include a plurality of data lines 132, a plurality of source electrodes 134 and a plurality of drain electrodes 136.

In an exemplary embodiment, the gate wirings 102 and 104 and the data wirings 132, 143 and 136 may include at least one selected from: an aluminum-based metal such as aluminum (Al) and an aluminum alloy; a silver-based metal such as silver (Ag) and a silver alloy; a copper-based metal such as copper (Cu) and a copper alloy; a molybdenum-based metal such as molybdenum (Mo) and a molybdenum alloy; chrome (Cr); titanium (Ti); and tantalum (Ta). In such an embodiment, the gate wirings 102 and 104 and the data wirings 132, 143 and 136 may have a multi-layer structure of conductive films (not shown) having different physical properties from each other. In one exemplary embodiment, for example, one of the conductive films may include or be made of an aluminum-based metal, a silver-based metal, a copper-based metal, etc., and the other of the conductive films may include or be made of a molybdenum-based metal, chrome, titanium, tantalum, etc. In one exemplary embodiment, for example, the multi-layer structure of conductive films may include a set of a chrome lower film and an aluminum upper film, or a set of an aluminum lower film and a molybdenum upper film. However, the materials of the gate wirings 102 and 104 and the data wirings 132, 134 and 136 are not limited to those described above but may include a variety of metals and conductors.

The gate lines 102 may extend in a first direction X, for example, along horizontal boundaries between pixels. The data lines 132 may extend in a second direction Y, for example, along vertical boundaries between pixels. The gate lines 102 and the data lines 132 may intersect one another to thereby define pixel areas. In an exemplary embodiment, each of the pixel areas may be defined as an area surrounded by the respective gate lines and data lines, but not being limited thereto.

At least one gate electrode 104 is connected to each of the gate lines 102 in every pixel. The gate electrode 104 may be defined by a portion branched from the gate line 102 toward the semiconductor layer 122 or by an expanded portion or an expansion of the gate line 102. However, such features are merely illustrative, and the gate electrode 104 may be defined in the area where the semiconductor layer 122 overlaps an extended path of the gate line 102.

At least one source electrode 134 is connected to each of the data lines 132 in every pixel. The source electrode 134 may be defined by a portion branched from the data line 132 toward the semiconductor layer 122 or by an expanded portion or an expansion of the data line 132. However, such features are merely illustrative, and the source electrode 104 may be defined in the area where the semiconductor layer 122 overlaps an extended path of the data line 132. A drain electrode 136 may be spaced apart from the source electrode 104 with the semiconductor layer 122 therebetween and may be electrically connected to the pixel electrode 182 via a contact hole 136a defined through a first passivation layer 142 and an organic layer 154.

A gate insulation film 112 may be disposed between the gate wirings 102 and 104 and the data wirings 132, 134 and 136. In an exemplary embodiment, the gate insulation film 112 may be disposed on the gate wirings 102 and 104, and the data wirings 132, 134 and 136 may be disposed on the gate insulation film 112. The gate insulation film 112 may include or be made of, for example, silicon nitride ($SiN_x$), silicon dioxide ($SiO_2$), silicon oxynitride (SiON) or a combination (e.g., a stack) thereof. The gate insulation film 112 may insulate the gate wirings 102 and 104 from conductive thin films such as the data lines 132 thereon.

The semiconductor layer 122 may be disposed on the gate insulation film 112 and may be made of hydrogenated amorphous silicon, polycrystalline silicon, etc. The semiconductor layer 122 overlaps at least a part of the gate electrode 104. The semiconductor layer 122, together with the gate electrode 104, the source electrode 134 and the drain electrode 136, collectively define a thin-film transistor.

The semiconductor layer 122 may have a variety of shapes such as an island or line shape. Although the semiconductor layer 122 shown in FIG. 3 has an island shape, such features are merely illustrative. Although not shown in the drawings, the island-like semiconductor layer 122 may overlap the data wirings 132, 134 and 136.

An ohmic contact layer 124 may be disposed on the semiconductor pattern layer 122, which is made of n+ hydrogenated amorphous silicon highly doped with an n-type impurity or the like. The ohmic contact layer 124 is disposed on the top of the semiconductor layer 122 and under the source electrode 134 and the drain electrode 136, thereby reducing contact resistance. The ohmic contact layer 124 may have a variety of shapes such as an island or line shape, like the semiconductor layer 122. In an exemplary embodiment, where the semiconductor layer 122 has an island shape, the ohmic contact layer 124 may also have an island shape. In an alternative exemplary embodiment, where the semiconductor layer 122 has a line shape, the ohmic contact layer 124 may also have a line shape. Unlike the semiconductor layer 122, the ohmic contact layer 124 has a separated space between the source electrode 134 and the drain electrode 136, so that the semiconductor layer 122 may be exposed via the space. A part of the semiconductor layer 122 under the separated space between the source electrode 134 and the drain electrode 136 may be a channel.

When the gate electrode 104 receives a gate on signal and a channel is thereby formed in the semiconductor layer 122, a thin-film transistor is turned on. Then, the drain electrode 136 may receive a data signal from the source electrode 134 and transmit the data signal to the pixel electrode 192.

The first passivation layer 142 may be disposed on the data wirings 132, 134 and 136 and the exposed part of the semiconductor layer 122. The first passivation layer 142 may include at least one selected from an inorganic material such as silicon nitride or silicon oxide, and a material such as a-Si:C:O, a-Si:O:F, etc., and may be formed by the plasma enhanced chemical vapor deposition ("PECVD"), for example.

The organic layer 154 may be disposed on the first passivation layer 142. The organic layer 154 may include a material having high planarization characteristics and photosensitivity.

A contact hole 136a may be defined or formed in first passivation layer 142 and the organic layer 154, via which at least a part of the drain electrode 136 is exposed. At least a part of the drain electrode 136 exposed via the contact hole 136a may come in contact with the pixel electrode 182. As a result, the drain electrode 136 may be electrically coupled with/connected to the pixel electrode 182.

The organic layer 154 is disposed also in the non-display area NDA in addition to the display area DA. The structure of the organic layer 154 disposed in the non-display area NDA will be described below.

In some embodiments, as shown in FIG. 3, a color filter 152 may be disposed between the organic layer 154 and the first passivation layer 142. The color filter 152 may include a red ("R") color filter, a green ("G") color filter and a blue ("B") color filter. One of the R, G and B color filters is formed in a pixel, forming R, G and B pixels. The color filter 152 may be disposed such that the color filter 152 overlaps the pixel electrode 182. The color filter 152 may include a photosensitive organic material including a pigment. The organic layer 154 on the color filter 152 may planarize an uneven surface due to level differences among the R, G and B color filters. The color filter 152 may be covered by the organic layer 154. However, such features are merely illustrative and the invention is not limited thereto.

The common electrode 162 may be disposed on the organic layer 154. The common electrode 182 may receive a common voltage and, along with the pixel electrode 182, may generate electric field to control orientations of liquid crystal molecules in the liquid-crystal layer 300. The common electrode 162 includes an opening via which the contact hole 136a is exposed. In such an embodiment, at least a part of the drain electrode 136 may be exposed via the opening defined in the common electrode 162. The common electrode 162 may be a single piece or a single unitary and indivisible unit, which is disposed throughout or covering the entire pixel area surrounded by the gate lines 102 and the data lines 132 except for the opening. The common electrode 162 may include or be made of, but is not limited to, a transparent conductive material such as indium tin oxide ("ITO") or indium zinc oxide ("IZO").

Although the color filter 152 and the common electrode 162 are disposed on the first substrate 100 in an exemplary embodiment as shown in FIG. 3, such features are merely illustrative. In an alternative exemplary embodiment, the color filter 152 and the common electrode 162 may be disposed on the second substrate 200.

A second passivation layer 172 may be disposed on the common electrode 162 and the organic layer 154. The second passivation layer 172 may include an opening via which the contact hole 136a is exposed. In an exemplary embodiment, at least a part of the drain electrode 136 may be exposed via the opening defined or formed in the second passivation layer 172. The second passivation layer 172 may be an inorganic insulative material. In one exemplary embodiment, for example, the second passivation layer 172 may include silicon nitride, silicon oxide, etc. The second passivation layer 172 may be disposed between the pixel electrode 182 and the common electrode 162 and may insulate the pixel electrode 182 from the common electrode 162

The pixel electrode 182 may be disposed on the second passivation layer 172 in every unit pixel. A part of the pixel electrode 182 may be disposed in the contact hole 136a to contact the drain electrode 136.

The pixel electrode 182, along with the common electrode 162, may generate electric field to rotate liquid crystal molecules included in the liquid-crystal layer 300. The pixel electrode 182 may include, but is not limited to, a transparent conductive material such as ITO or IZO.

The pixel electrode 182 may include a plurality of slit patterns 182 in at least one of various shapes including quadrangular, closed curve or fish-bone shapes. Although FIG. 1 shows an exemplary embodiment where slit patterns 182a is in a stripe pattern, the shape of the slit patterns 182a may be variously modified as desired by those skilled in the art.

A light-blocking pattern 192 may be disposed on the second passivation layer 172 and the pixel electrode 182. The light-blocking pattern 192 effectively prevents light from leaking. The light-blocking pattern 192 may be disposed in a thin-film transistor area and non-pixel areas (between pixels, gate line and data line areas). The light-blocking pattern 192 may be disposed in the contact hole 136a as shown in FIG. 3. However, such features are s merely illustrative, and the invention is not limited thereto.

The light-blocking pattern 192 may include or be made of a black organic polymer material including a black dye or pigment, or a metal (metal oxide) such as chrome, a chrome oxide, etc.

Figure 4:
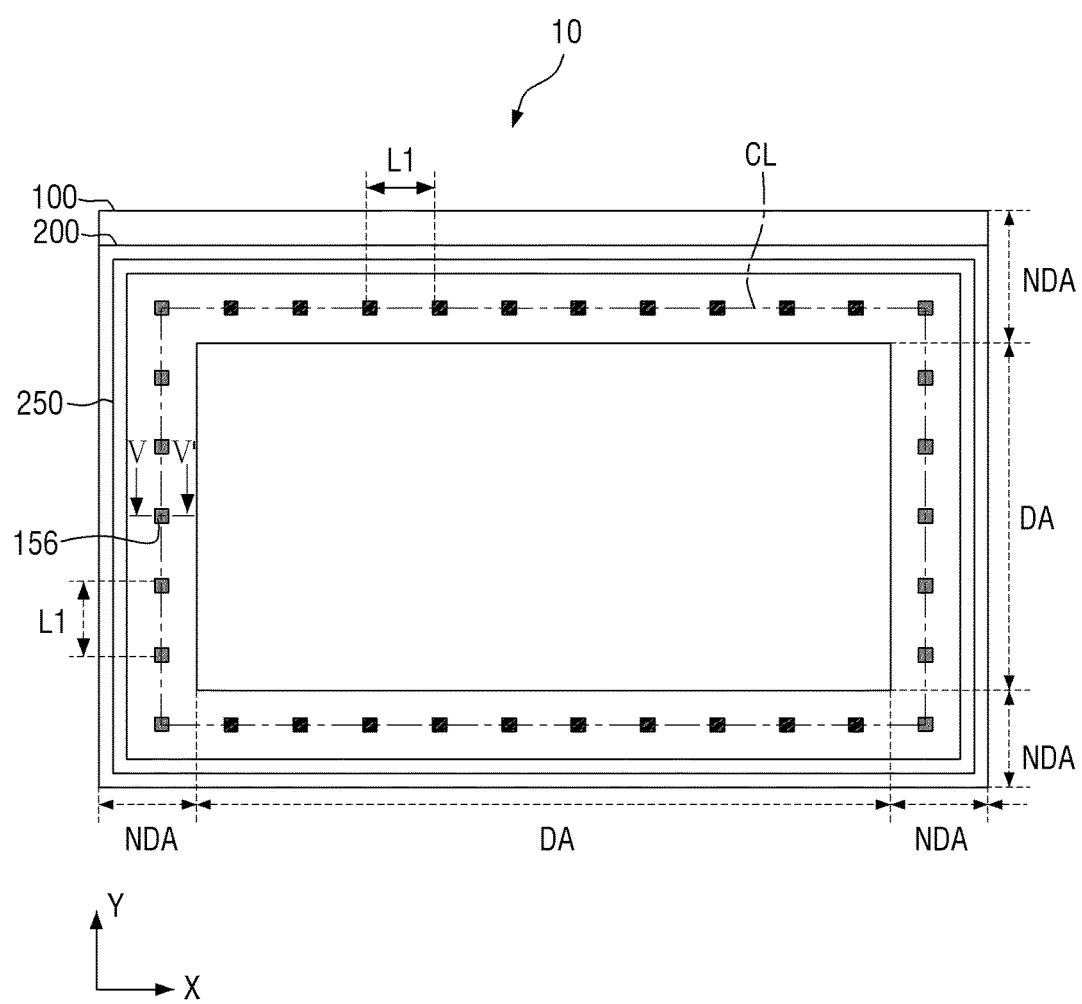
FIG. 4 is a schematic plan view for illustrating the structure of a protruding portion on an organic layer disposed in a non-display area of an LCD device according to an exemplary embodiment of the disclosure.

A column spacer 194 for maintaining a gap between the first substrate 100 and the second substrate 200 may be disposed on the light-blocking pattern 192. In some embodiments, an end of the column spacer 194 may be in contact with the second substrate 200 as shown in FIG. 4. However, such features are merely illustrative. The end of the column spacer 194 may be spaced apart from the second display substrate 200 by a predetermined distance.

Although not shown in the drawings, the column spacer 194 may include a plurality of column spacers having different levels or heights from each other. In one exemplary embodiment, for example, the column spacers 194 may include a main column spacer having a relatively high level and a sub column spacer having a relatively low level. In such an embodiment, the gap between the first substrate 100 and the second substrate 200 may be maintained primarily by the main column spacer when an external pressure is applied. The gap between the first substrate 100 and the second substrate 200 may be maintained secondarily by the sub column spacer when a stronger external pressure is applied.

The column spacer 194 may be disposed above the thin-film transistor. At least a part of the column spacer 194 may overlap the gate wirings 112 and 114. However, such features are merely illustrative, that the location of the column spacer 194 is not limited thereto.

An alignment film (not shown) may be disposed on a surface of each of the first substrate 100 and the second substrate 200 facing the liquid-crystal layer 300. In such an embodiment, the alignment film (not shown) for aligning the liquid-crystal layer 300 may be disposed on the pixel electrode 182, the second passivation film 172, the light-blocking pattern 192 and the column spacer 194.

In some embodiments, the column spacer 194 may include or be made of the same material as that of the light-blocking pattern 192. The column spacer 194 and the light-blocking pattern 192 may include or be formed together via the same exposure process using a halftone mask or a slit mask. In such an embodiment, the column spacers 194 and the light-blocking pattern 192 may include or be made of the same material, and may be implemented as a single piece or integrally formed as a single unitary and indivisible unit.

Hereinafter, a structure of the organic layer 154 disposed in the non-display area NDA will be described in detail.

Figure 5:
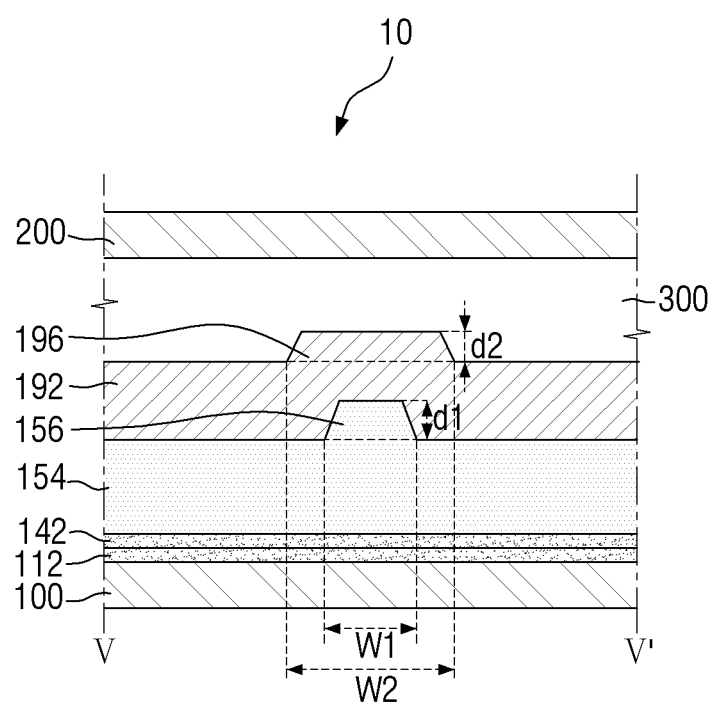
FIG. 5 is a cross-sectional view taken along line V-V' of FIG. 4.

FIG. 4 is a schematic plan view for illustrating the structure of a protruding portion on an organic layer disposed in a non-display area of an LCD device according to an exemplary embodiment of the disclosure. FIG. 5 is a cross-sectional view taken along line V-V' of FIG. 4.

Referring to FIGS. 4 and 5, the organic layer 154 includes a protruding portion 156 disposed in a non-display area NDA of a first substrate 100. The protruding portion 156 may protrude from a top surface of the organic layer 154 disposed in the non-display area NDA by a predetermined height d1, thereby creating a level difference.

The light-blocking pattern 192 is disposed on the organic layer 154 and includes a step 196 protruding from a top surface thereof disposed in the non-display area NDA by a predetermined height d2 corresponding to the protruding portion 156 of the organic layer 154. At least a part of the step 196 may overlap the protruding portion 156. The height d2 of the step 196 may be lower than the height d1 of the protruding portion 156. The height d2 of the step 196 may be lower than the height of the column spacer 194.

In the process of fabricating an LCD device, the first substrate 100 may be coupled with the second substrate 200 in a way such that a liquid-crystal layer is disposed on the first substrate 100 and the second substrate 200 is placed above the first substrate 100 and pressed. In such an embodiment, the second substrate 200 may be dented downwards by the pressure, so that the first substrate 100 may adhere to the second substrate 200, e.g., to the non-display area NDA of the second substrate 200. When the first substrate 100 adheres to the second substrate 200, liquid crystals may not properly spread out to the non-display area NDA, and thus an empty space in the liquid crystals may be seen by a viewer.

In the LCD device 10 according to an exemplary embodiment of the disclosure, the organic layer 154 includes the protruding portion 156 and the step 196 is thereby formed on the light-blocking pattern 192. As a result, in such an embodiment, even when the second substrate 200 is dented downwards during the process of fabricating the LCD device 10, the second substrate 200 may be supported by the step 156 on the light-blocking pattern 192 primarily. In such an embodiment, when the second substrate 200 is dented downwards, the gap between the first substrate 100 and the second substrate 200 may be effectively maintained by the step 196 on the light-blocking pattern 192. As a result, liquid crystals may spread properly throughout the non-display area NDA.

In some embodiments, the protruding portion 156 may have a dot shape when viewed from a top plan view, which is a plan view in a thickness direction of the LCD device 10. In one exemplary embodiment, for example, the protruding portion 156 may have a square shape having a predetermined width w1 when viewed from the top plan view, as shown in FIG. 4. The shape of the step 196 on the light-blocking pattern 192 formed due to the protruding portion 156 may be similar to the shape of the protruding portion 156, and may have a width w2 larger than the width w1 of the protruding portion 156. The protruding portion 156 may be located inside the step 196 or entirely covered by the step 196, when viewed from the top plan view, as shown in FIG. 5. However, the shape of the protruding portion 156 when viewed from the top plan view is not limited thereto but may have a triangular shape, a rectangular shape, a polygonal shape, a circular shape or an oval shape.

In some embodiments, the non-display area NDA may be disposed along the outer periphery of the display area DA. Accordingly, the non-display area NDA may be implemented as a band shape. In one exemplary embodiment, for example, referring to FIGS. 1 and 4, when the display area DA has a quadrangular shape when viewed from the top plan view, the non-display area NDA has a quadrangular band shape.

In some embodiments, the organic layer 154 may include a plurality of protruding portions 156 having a dot shape when viewed from the top plan view. The plurality of protruding portion 156 may be disposed along the outer periphery of the display area DA, spaced apart from one another. As shown in FIG. 4, the distance L1 between the protruding portions 156 may be constant, for example, but not being limited thereto.

In some embodiments, the protruding portion 156 may be disposed between the display area DA and the sealing member 250. As shown in FIG. 4, in an exemplary embodiment, where the display area DA has a rectangular shape when viewed from the top plan view and the sealing member 250 is disposed along the outer periphery of the display area DA, the spacing area between the display area DA and the sealing member 250 may have a rectangular band shape. In such an embodiment, the protruding portion 156 may be disposed on an imaginary center line (hereinafter, "center line CL") defined along the spacing area between the display area DA and the sealing member 250, as shown in FIG. 4. The center line CL may be a line connecting center points of the spacing area between the display area DA and the sealing member 250. The center line CL may be a closed line.

The protruding portion 156 may be disposed on the center line CL, and thus the step 196 on the light-blocking pattern 192 may be defined on the center line CL. In such an embodiment, where the step 196 is defined on the center line CL and the second substrate 200 is dented downwards, the step 196 may effectively support the second substrate 200 with improved balance.

Although the center line CL when viewed from the top plan view has a rectangular shape in an exemplary embodiment shown in FIG. 4, such features are merely illustrative. The shape of the center line CL may be variously modified depending on the shapes of the display area DA and the sealing member 250.

Figure 6:
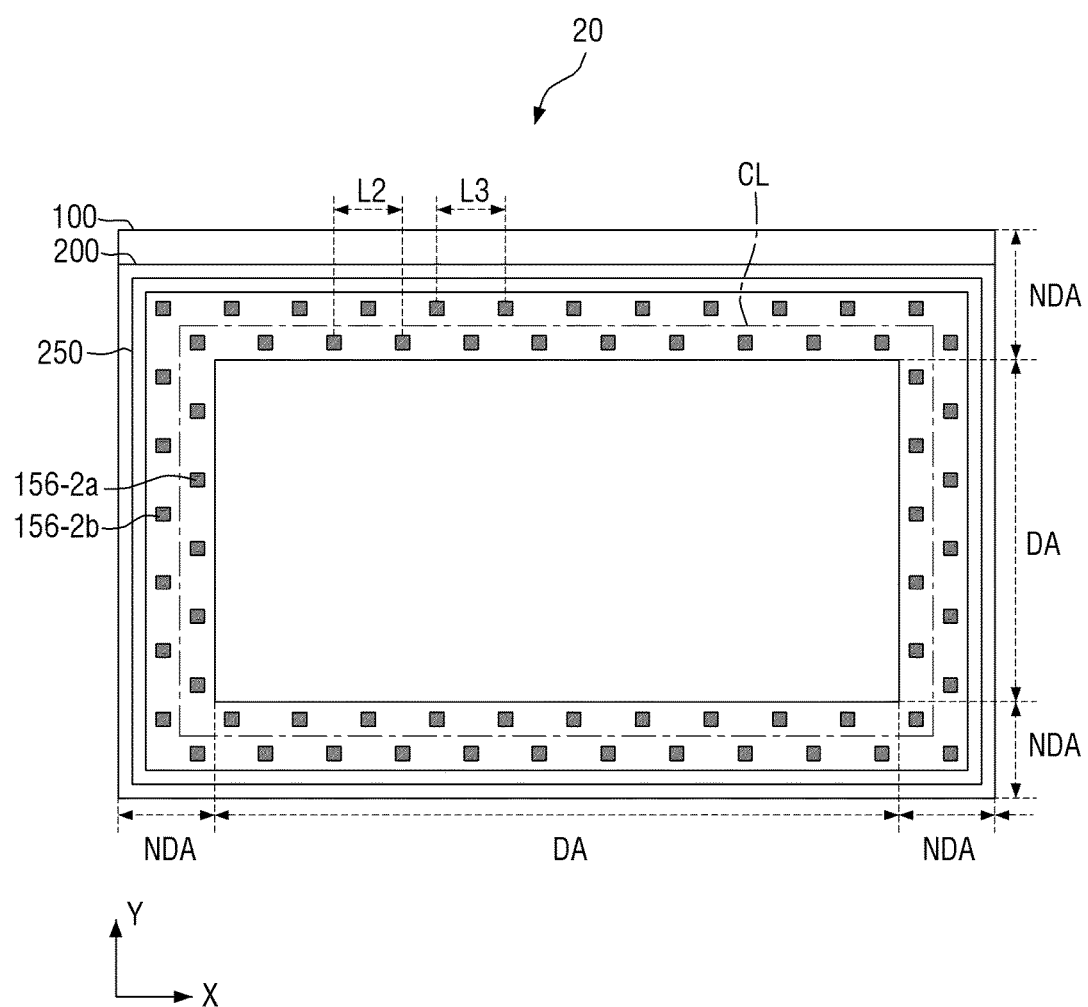
FIG. 6 is a schematic plan view for illustrating a structure of protruding portion on an organic layer disposed in a non-display area of an LCD device according to an alternative exemplary embodiment of the disclosure.

FIG. 6 is a schematic plan view for illustrating a structure of protruding portion on an organic layer disposed in a non-display area of an LCD device according to an alternative exemplary embodiment of the disclosure.

An exemplary embodiment of an LCD device 20 shown in FIG. 6 is identical to the LCD device 10 described above with respect to FIGS. 1 to 5, except for the configuration of protruding portions 156-2*a* and 156-2*b* on the organic layer 154. The same or like elements shown in FIG. 6 have been labeled with the same reference characters as used above to describe the exemplary embodiments of the LCD device 10 shown in FIGS. 1 to 5, and any repetitive detailed description thereof will hereinafter be omitted or simplified.

In an exemplary embodiment, as shown in FIG. 6, the organic layer 154 includes first protruding portions 156-2*a* and second protruding portions 156-2*b*. The first protruding portion 156-2*a* may be disposed more to an inside of the non-display area NDA than the second protruding portion 156-2*b*.

Referring to FIG. 6, in some embodiments, the first protruding portion 156-2*a* may be disposed on an inner side of a spacing area between the display area DA and the sealing member 250 with respect to the center line CL, and the second protruding portion 156-2*b* may be disposed on an outer side of the spacing area between the display area DA and the sealing member 250 with respect to the center line CL.

In some embodiments, the first protruding portion 156-2*a* may be disposed in the middle or on a center line (not shown) of a spacing area between the display area DA and the center line CL, and the second protruding portion 156-2*b* may be disposed in the middle or on a center line (not shown) of a spacing area between the center line CL and the sealing member 250. However, such features are merely illustrative, and the arrangement of the first protruding portion 156-2*a* and the second protruding portion 156-2*b* is not limited thereto.

In some embodiments, the organic layer 154 may include a plurality of first protruding portions 156-2*a* and a plurality of second protruding portions 156-2*b* having a dot shape when viewed from the top plan view. In some embodiments, the plurality of first protruding portions 156-2*a* may be disposed along the outer periphery of the display area DA, spaced apart from one another by a predetermined distance L2. The plurality of second protruding portions 156-2*b* may be disposed along the outer periphery of the display area DA, spaced apart from one another by a predetermined distance L3. The distance L2 between the first protruding portions 156-2*a* may be equal to about the distance L3 between the second protruding portions 156-2*b*, but not being limited thereto.

In some embodiments, the plurality of second protruding portions 156-2*b* may be arranged in a way such that the plurality of second protruding portions 156-2*b* are spaced apart from the first protruding portions 156-2*a* in a diagonal direction with respect to the row direction or the column direction. The row direction refers to the horizontal direction of FIG. 6. The column direction refers to the vertical direction of FIG. 6. In such an embodiment, the plurality of first protruding portions 156-2*a* and the plurality of second protruding portions 156-2*b* may be alternately arranged in a zigzag pattern with the center line CL therebetween.

In such an embodiment, where the plurality of first protruding portions 156-2*a* and the plurality of second protruding portions 156-2*b* are arranged in a zigzag pattern with the center line CL therebetween, the steps 196 on the light-blocking pattern 192 may also be arranged in a zigzag pattern with the center line CL therebetween. In such an embodiment where the steps 196 are arranged in the zigzag pattern with the center line CL therebetween, the steps 196 may effectively support the second substrate 200 with improved balance when the second substrate 200 is dented downwards. However, such features are merely illustrative, and the arrangement of the first protruding portion 156-2*a* and the second protruding portion 156-2*b* is not limited thereto.

Figure 7:
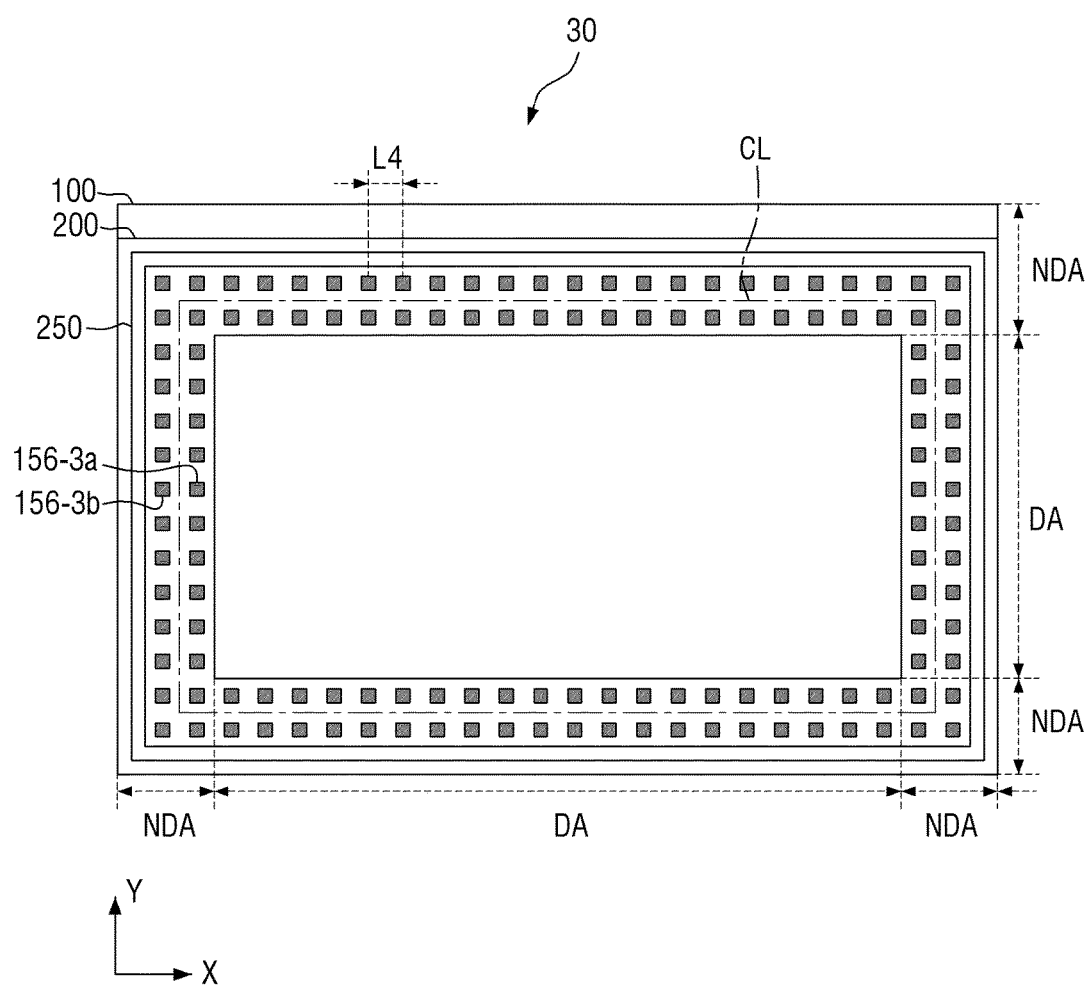
FIGS. 7 and 8 are schematic plan views for illustrating the structure of protruding portions on an organic layer disposed in a non-display area of an LCD device according to another alternative exemplary embodiment of the disclosure.

FIG. 7 is a schematic plan view for illustrating the structure of protruding portions on an organic layer disposed in a non-display area of an LCD device according to another alternative exemplary embodiment of the disclosure.

An exemplary embodiment of an LCD device 30 shown in FIG. 7 is substantially identical to an exemplary embodiment of the LCD device 10 described above with respect to FIGS. 1 to 5, except for the configuration of protruding portions 156-3*a* and 156-3*b* on an organic layer 154. The same or like elements shown in FIG. 7 have been labeled with the same reference characters as used above to describe the exemplary embodiments of the LCD device 10 shown in FIGS. 1 to 5, and any repetitive detailed description thereof will hereinafter be omitted or simplified.

In an exemplary embodiment, as shown in FIG. 7, the organic layer 154 includes first protruding portions 156-3*a* and second protruding portions 156-3*b*. The first protruding portion 156-3*a* may be disposed more to the inside of the non-display area NDA than the second protruding portion 156-2*b*.

Referring to FIG. 7, in some embodiments, the first protruding portions 156-3*a* may be disposed on the inner side of a spacing area between the display area DA and the sealing member 250 with respect to the center line CL, and the second protruding portions 156-3*b* may be disposed on the outer side of the spacing area between the display area DA and the sealing member 250 with respect to the center line CL.

In some embodiments, the first protruding portions 156-3*a* may be disposed in the middle or on a center line (not shown) of a spacing area between the display area DA and the center line CL, and the second protruding portion 156-3*b* may be disposed in the middle or on a center line (not shown) of a spacing area between the center line CL and the sealing member 250. However, such features are merely illustrative, and the arrangement of the first protruding portions 156-3*a* and the second protruding portions 156-3*b* is not limited thereto.

In some embodiments, the organic layer 154 may include a plurality of first protruding portions 156-3*a* and second protruding portions 156-3*b* having a dot shape when viewed from the top plan view. In some embodiments, the plurality of first protruding portions 156-3*a* may be disposed along the outer periphery of the display area DA, spaced apart from one another by a predetermined distance L4. The plurality of second protruding portions 156-3*b* may be disposed along the outer periphery of the display area DA, spaced apart from one another by a predetermined distance L4. In such an embodiment, the distance L4 between the first protruding portions 156-3*a* may be equal to about the distance L4 between the second protruding portions 156-3*b*.

In some embodiments, the plurality of second protruding portions 156-3*b* may be arranged in a way such that the plurality of second protruding portions 156-3*b* are spaced apart from the plurality of first protruding portions 156-3*a* in the row direction or the column direction. The row direction refers to the horizontal direction of FIG. 7. The column direction refers to the vertical direction of FIG. 7. Accordingly, the plurality of first protruding portions 156-3*a* and the plurality of second protruding portions 156-3*b* may be arranged in a way such that the plurality of first protruding portions 156-3*a* and the plurality of second protruding portions 156-3*b* are laterally or vertically symmetrical with the center line CL therebetween.

In such an embodiment, where the plurality of first protruding portions 156-3*a* and the plurality of second protruding portions 156-3*b* are arranged as described above such that the plurality of first protruding portions 156-3*a* and the plurality of second protruding portions 156-3*b* are laterally or vertically symmetrical with the center line CL therebetween, the steps 196 on the light-blocking pattern 192 may also be arranged to be laterally or vertically symmetrical with the center line CL therebetween. In such an embodiment, where the steps 196 are arranged to be laterally or vertically symmetrical with the center line CL therebetween, the steps 196 may effectively support the second substrate 200 with improved balance when the second substrate 200 is dented downwards. However, such features are merely illustrative, and the arrangement of the plurality of first protruding portions 156-3*a* and the plurality of second protruding portions 156-3*b* is not limited thereto.

Figure 8:
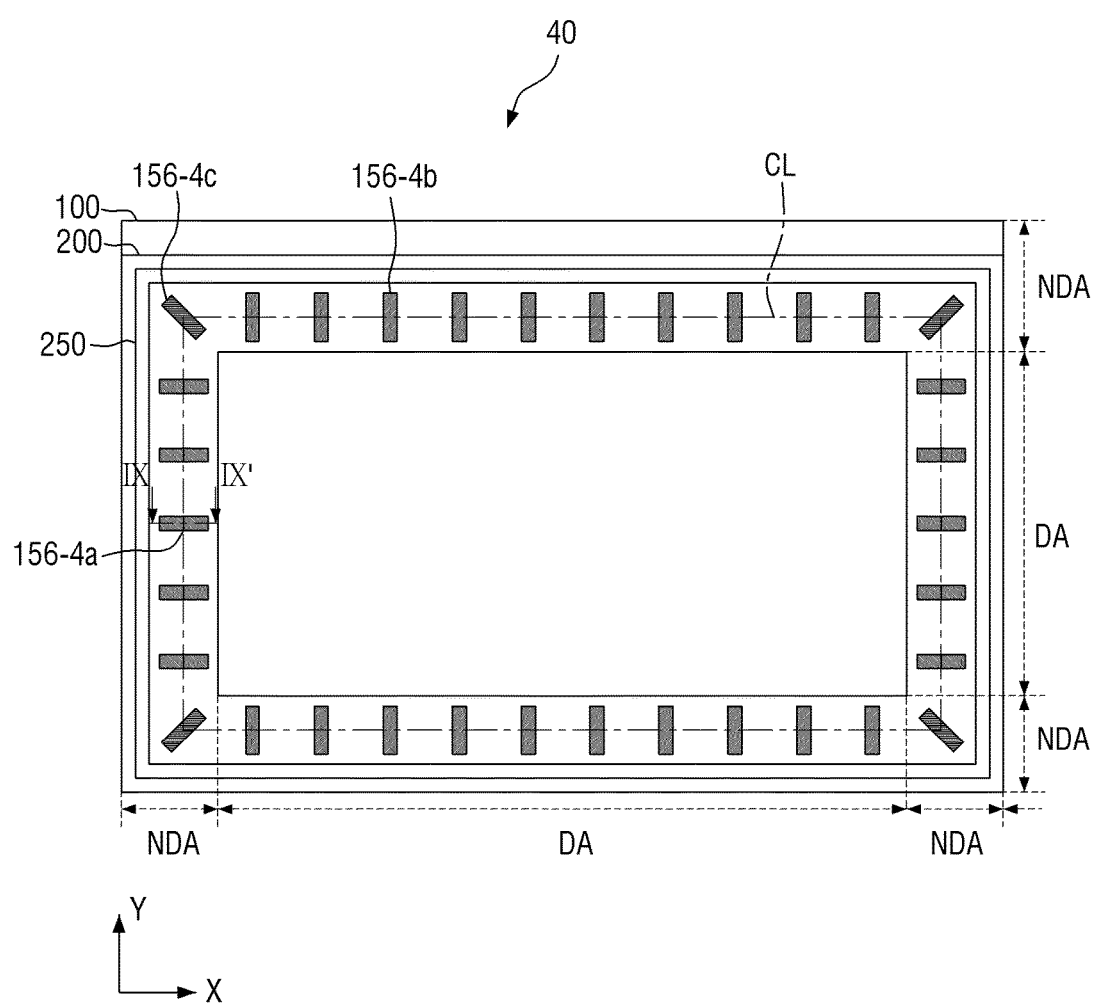
Figure 9:
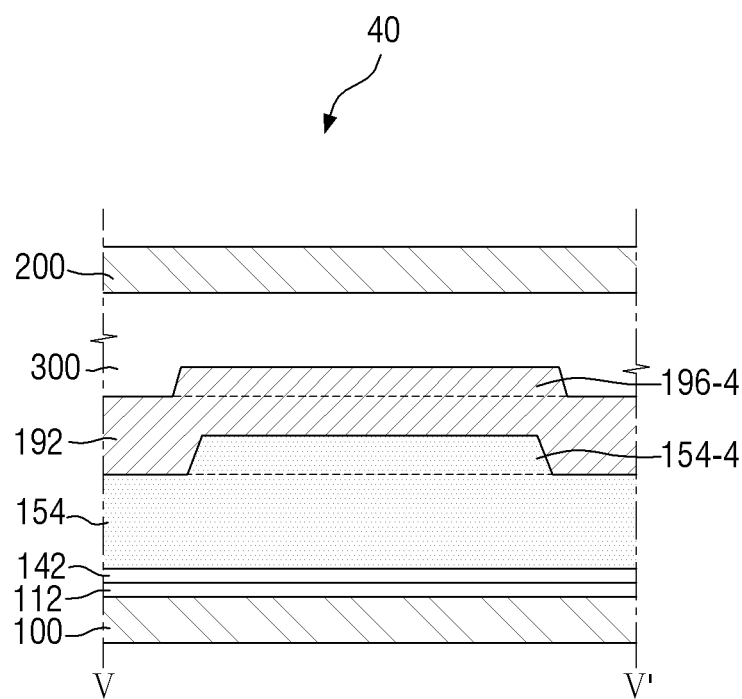
FIG. 9 is a cross-sectional view taken along line IX-IX' of FIG. 8.

FIG. 8 is a schematic plan view for illustrating the structure of protruding portions on an organic layer disposed in a non-display area of an LCD device according to yet another alternative exemplary embodiment of the disclosure. FIG. 9 is a cross-sectional view taken along line IX-IX' of FIG. 8.

An exemplary embodiment of an LCD device 40 shown in FIG. 8 is substantially identical to an exemplary embodiment of the LCD device 10 described above with respect to FIGS. 1 to 5, except for the configuration of protruding portions 156-4*a*, 156-4*b* and 156-4*c* on an organic layer 154. The same or like elements shown in FIG. 8 have been labeled with the same reference characters as used above to describe the exemplary embodiments of the LCD device 10 shown in FIGS. 1 to 5, and any repetitive detailed description thereof will hereinafter be omitted or simplified.

In an exemplary embodiment, as shown in FIG. 8, the protruding portions 156-4*a*, 156-4*b* and 156-4*c* on the organic layer 154 have a shape extending in a predetermined direction when viewed from the top plan view. In such an embodiment, where the protruding portions 156-4*a*, 156-4*b* and 156-4*c* have the extended shape, a step 196-4 on the light-blocking pattern 192 may also have a shape extending in the same direction. In some embodiments, the protruding portions 156-4a, 156-4b and 156-4c may have a rectangular shape when viewed from the top plan view, but not being limited thereto.

In some embodiments, the center of the protruding portions 156-4a, 156-4b and 156-4c in the extending direction may be disposed on the center line CL of a spacing area between the display area DA and the sealing member 250. In such an embodiment, the protruding portions 156-4a, 156-4b and 156-4c may have a shape symmetrical with respect to the center line CL. However, such features are merely illustrative, and the relationship between the protruding portions 156-4a, 156-4b and 156-4c and the center line CL is not limited thereto.

In some embodiments, the protruding portions 156-4a, 156-4b and 156-4c may include first protruding portions 156-4a, second protruding portions 156-4b and third protruding portions 156-4c which extend in different directions from each other.

In some embodiments, the organic layer 154 may include a plurality of first protruding portion 156-4a, a plurality of second protruding portions 156-4b, and a plurality of third protruding portions 156-4c. The plurality of first protruding portion 156-4a, the plurality of second protruding portions 156-4b, and the plurality of third protruding portions 156-4c may be disposed along the outer periphery of the distance area DA, spaced apart from one another.

Referring to FIG. 8, in an exemplary embodiment where the display area DA has a rectangular shape when viewed from the top plan view, the organic layer 154 may include first protruding portions 156-4a extending in the row direction (x-direction), second protruding portions 156-4b extending in the column direction (y-direction), and third protruding portions 156-4c extending in diagonal directions with respect to the row or column direction. In one exemplary embodiment, for example, the first protruding portions 156-4a extending in the row direction (x-direction) may be disposed in the non-display area NDA on the left and right sides of the display area DA, as shown in FIG. 8. In such an embodiment, the second protruding portions 156-4b extending in the column direction (y-direction) may be disposed in the non-display area NDA on the upper and lower sides of the display area DA, and the third protruding portions 156-4c extending in diagonal directions with respect to the row or column direction may be disposed in the non-display area NDA at the corners of the display area DA.

In such an embodiment, although the first protruding portions 156-4a, the second protruding portions 156-4b and the third protruding portions 156-4c extend in different directions, all of the first protruding portions 156-4a, the second protruding portions 156-4b and the third protruding portions 156-4c extend toward the display area DA. In such an embodiment, where the first protruding portions 156-4a, the second protruding portions 156-4b and the third protruding portions 156-4c extend toward the display area DA, liquid crystals may spread out without being blocked when the first substrate 100 is coupled with the second substrate 200 during the process of fabricating the LCD device. In such an embodiment, the liquid crystals may spread out evenly to reach even the edge of the non-display area NDA.

Figure 10:
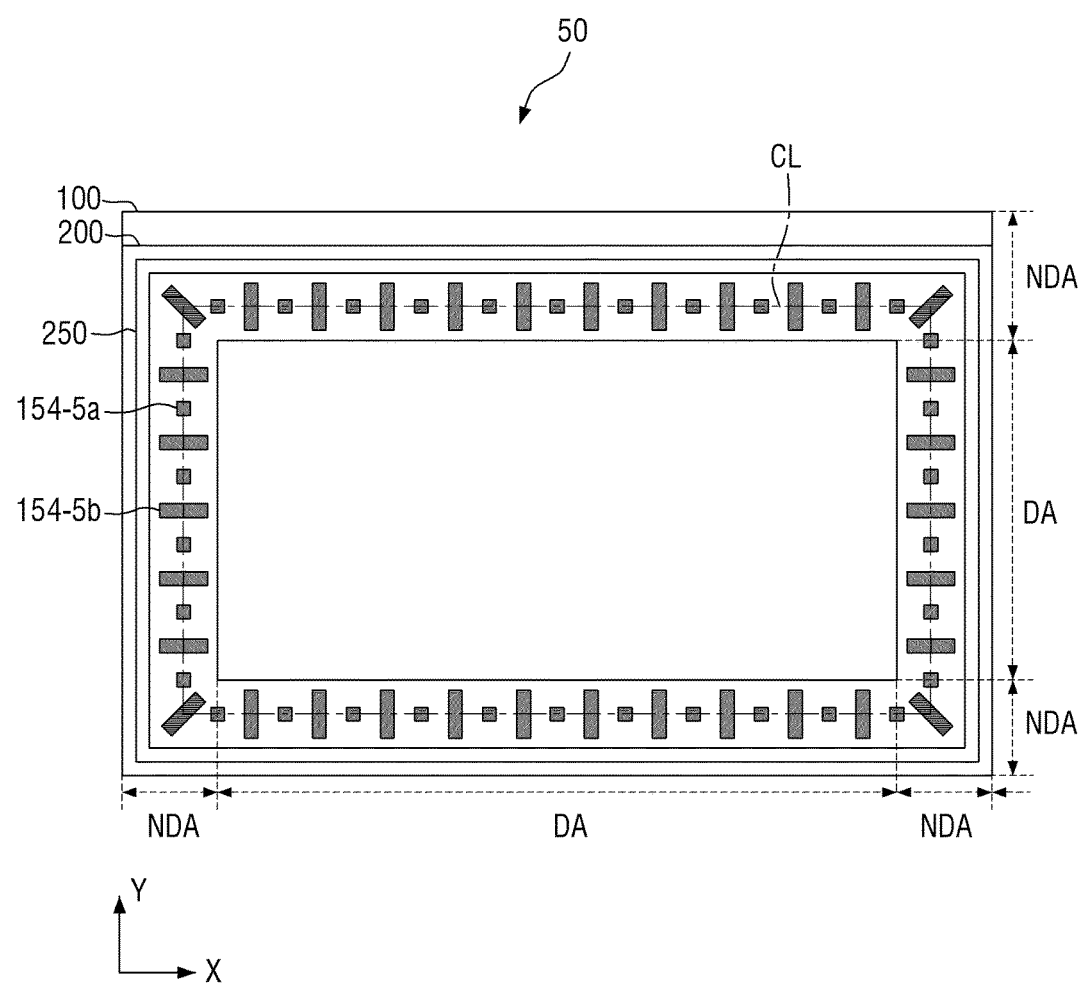
FIG. 10 is a schematic plan view for illustrating the structure of protruding portions on an organic layer disposed in a non-display area of an LCD device according to yet another alternative exemplary embodiment of the disclosure.

FIG. 10 is a schematic plan view for illustrating the structure of protruding portions on an organic layer disposed in a non-display area of an LCD device according to yet another exemplary embodiment of the disclosure.

An LCD device 50 according to this exemplary embodiment shown in FIG. 10 is substantially identical to the LCD device 40 described above with respect to FIGS. 8 and 9, except for the configuration of protruding portions 156-5a and 156-5b on an organic layer 154. The same or like elements shown in FIG. 10 have been labeled with the same reference characters as used above to describe the exemplary embodiments of the LCD device 40 shown in FIGS. 8 and 9, and any repetitive detailed description thereof will hereinafter be omitted or simplified.

In an exemplary embodiment, as shown in FIG. 10, the organic layer 154 includes first protruding portions 156-5a and second protruding portions 156-5b. The first protruding portion 156-5a has a dot shape when viewed from the top plan view, and the second protruding portion 156-5b has a shape extending in a predetermined direction when viewed from the top plan view. Accordingly, the width of the second protruding portion 156-5b in the extending direction may be larger than the width of the first protruding portion 156-5a in the extending direction.

The shape and the arrangement of the first protruding portions 156-5a are substantially identical to those described above with respect to FIGS. 1 to 5. The shape and the arrangement of the second protruding portions 156-5b are substantially identical to those described above with respect to FIGS. 8 and 9.

In some embodiments, the organic layer 154 may include a plurality of first protruding portions 156-5a and a plurality of second protruding portions 156-5b. The plurality of first protruding portion 156-5a and the plurality of second protruding portions 156-5b may be disposed along the outer periphery of the distance area DA, spaced apart from one another. The first protruding portions 156-5a and the second protruding portions 156-5b may be arranged alternately as shown in FIG. 10.

Hereinafter, a method of fabricating an LCD device according to an exemplary embodiment of the disclosure will be described.

FIGS. 11 to 23 are cross-sectional views for illustrating processes of a method of fabricating an LCD device according to an exemplary embodiment of the disclosure.

Figure 11:
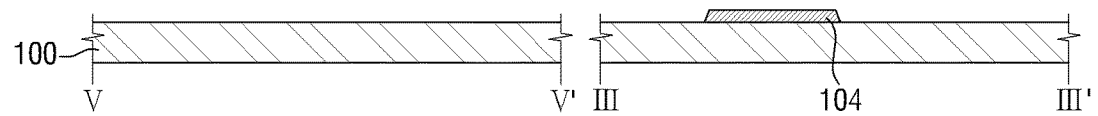
FIGS. 11 to 23 are cross-sectional views for illustrating processes of a method of fabricating an LCD device according to an exemplary embodiment of the disclosure.

Initially, referring to FIGS. 2, 3 and 11, gate wirings 102 and 104 are provided or formed on a first substrate 100.

A first metal layer (not shown) is formed on the first substrate 100 including or made of a transparent material such as glass or quartz, for example. The first metal layer (not shown) may include or be made of aluminum, copper, silver, molybdenum, chrome, titanium or an alloy thereof, and may include two or more layers having different physical properties from each other. The first metal layer (not shown) may be deposited by a sputtering process, for example. Subsequently, the first metal layer (not shown) is patterned by a photolithography process using a first exposure mask, thereby forming the gate wirings 102 and 104 including a gate line 102 and a gate electrode 104. The gate electrode 104 may have a protruding shape that branches off from the gate line 102.

Figure 12:
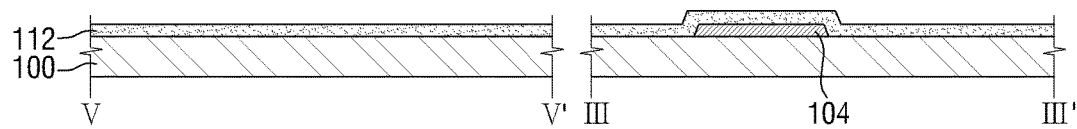

Subsequently, referring to FIG. 12, a gate insulation film 112 is provided or formed on the gate wirings 102 and 104. The gate insulation film 112 may be formed by the PECVD method and may include silicon nitride ($SiN_x$), silicon oxide ($SiO_2$), etc.

Figure 13:
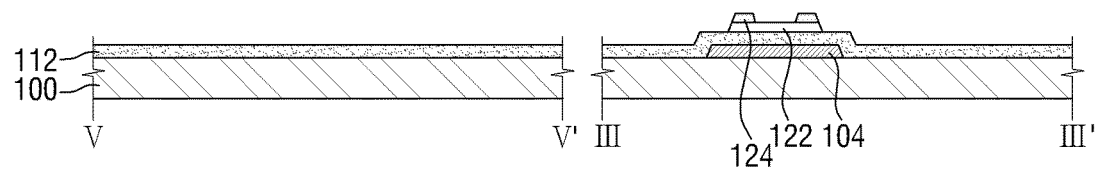

Subsequently, referring to FIG. 13, a semiconductor layer 122 and an ohmic contact layer 124 are provided or formed on the gate insulation film 112. The semiconductor layer 122 may include or be made of hydrogenated amorphous silicon or polycrystalline silicon. The semiconductor layer 122 and the ohmic contact layer 124 may be formed by a photolithography process.

Figure 14:
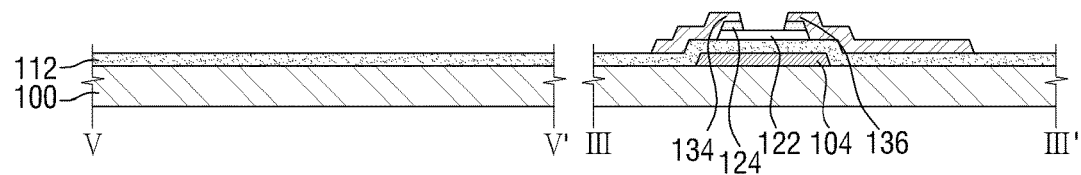

Subsequently, referring to FIG. 14, data wirings 132, 134 and 136 including a data line 132 intersecting a gate line 102 to define a unit pixel, a source electrode 134 and a drain electrode 136 are provided or formed on the gate insulation film 112, the semiconductor layer 122 and the ohmic contact layer 124 by a photolithography process. Like the gate wirings 102 and 104, the data wirings 132, 134 and 136 may include or be made of aluminum, copper, silver, molybdenum, chrome, titanium, tantalum or an alloy thereof, and may include two or more layers having different physical properties from each other.

Although the semiconductor layer 122 and the ohmic contact layer 124 are formed by the photolithography process different from the photolithography process by which the data wirings 132, 134 and 136 are formed, such features are merely illustrative. In an alternative exemplary embodiment, the semiconductor layer 122, the ohmic contact layer 124 and the data wirings 132, 134 and 136 may be formed by a photolithography process using a single mask. In such an embodiment, residuals of the semiconductor layer 122 and the ohmic contact layer 124 may remain under the data line 132. In such an embodiment, the semiconductor layer 122 and the ohmic contact layer 124 may have a line shape. The semiconductor layer 122, together with the gate electrode 104, the source electrode 134 and the drain electrode 136, may form a thin-film transistor and may form a channel.

Figure 15:
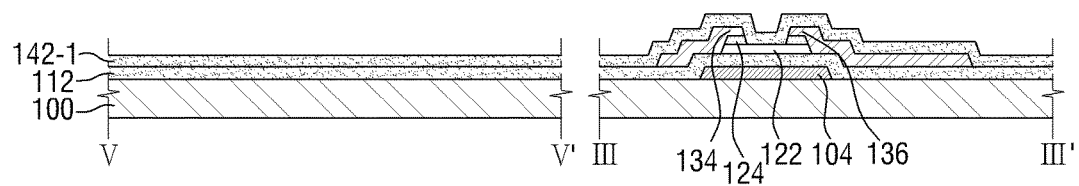

Subsequently, referring to FIG. 15, a first passivation layer 142-1 may be provided or formed on the first substrate 102 on which the thin-film transistor is formed. The first passivation film 142-1 may include or be made of an inorganic material such as silicon nitride or silicon oxide, and may include a material such as a-Si:C:O, a-Si:O:F, etc., which is formed by the PECVD method, for example.

Figure 16:
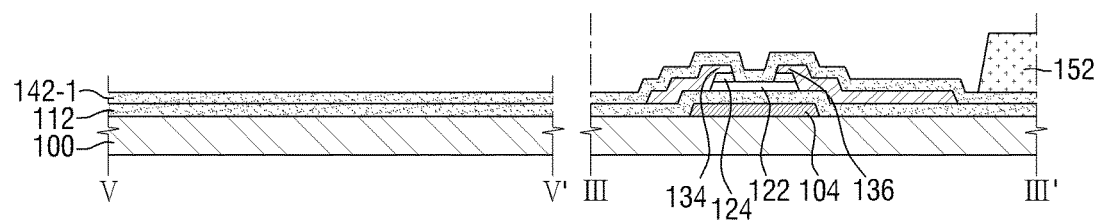

Subsequently, referring to FIG. 16, a color filter 152 may be provided or formed on the first passivation film 142-1. The color filter 152 may be disposed in a pixel area and may include an R color filter, a G color filter and a B color filter. The color filter 152 may include or be made of a photosensitive organic material containing a pigment.

The color filter 152 may be formed by a photolithography process, an inkjet printing method, or other varieties of methods.

In some embodiments, the color filter 152 may be formed by a stitch-shot process. In such embodiments, a single mask may be used continuously/repeatedly. However, such features are merely illustrative, and the method of forming the color filter 152 is not limited thereto.

Figure 17:
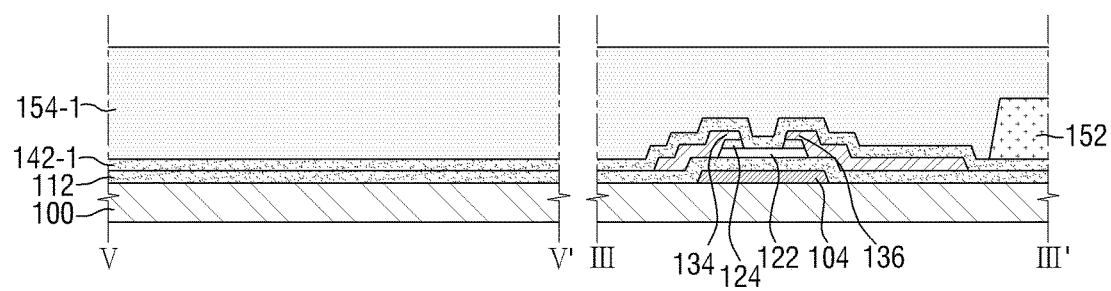

Subsequently, referring to FIG. 17, a first organic film 154-1 is provided or formed on the first passivation film 142-1 and the color filter 152. The organic film 154-1 may include or be made of a material having high planarization characteristics and photosensitivity. The first organic film 154-1 may be formed by a spin coating method, a slit coating method or a combination of the spin coating method and the slit coating method.

Figure 18:
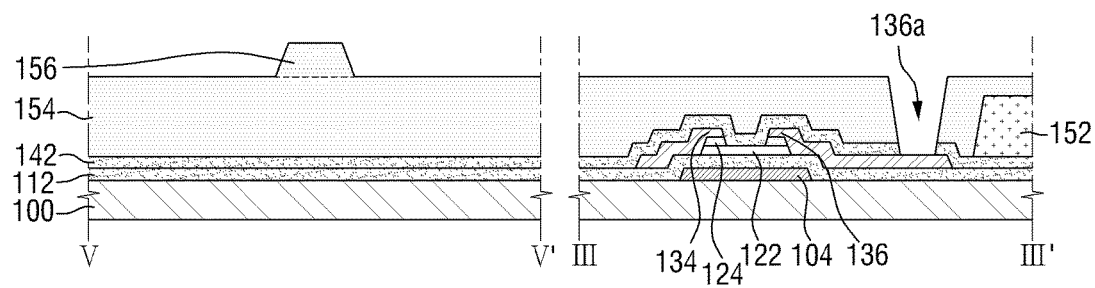

Subsequently, referring to FIG. 18, a contact hole 136*a* via which at least part of the drain electrode 136 is exposed may be formed in the first passivation film 142-1 and the color filter 154-1. In such an embodiment, the contact hole 136*a* may be formed in the first organic film 154-1 when forming the organic layer 154, and then the contact hole 136*a* may be formed in the first passivation film 142-1 when forming the first passivation layer 142.

In an exemplary embodiment, the first organic film 154-1 formed in the non-display area NDA may be exposed using a halftone mask or a slit mask, forming the organic layer 154 including the protruding portion 156. The organic layer 154 may be formed by a stitch-shot process. In such an embodiment, the mask for forming the non-display area NDA of the organic layer 154 may be different from the mask for forming the display area DA of the organic layer 154. The mask for forming the display area DA may be used continuously/repeatedly. However, such features are merely illustrative, and the method of forming the organic layer 154 is not limited thereto.

Figure 19:
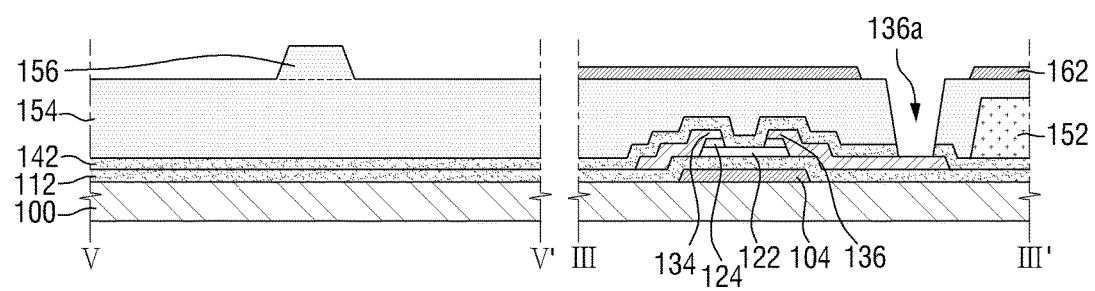

Subsequently, referring to FIG. 19, a common electrode 162 may be provided or formed on the organic layer 154. The common electrode 162 may include an opening via which the contact hole 136*a* is exposed. The common electrode 162 may be formed as a single piece or integrally formed as a single unitary and indivisible unit throughout the entire pixel area surrounded by the gate lines 102 and the data lines 132 except for the opening. The common electrode 162 may include or be made of, but not being limited to, a transparent conductive material such as polycrystalline, monocrystalline or amorphous ITO or IZO.

Figure 20:
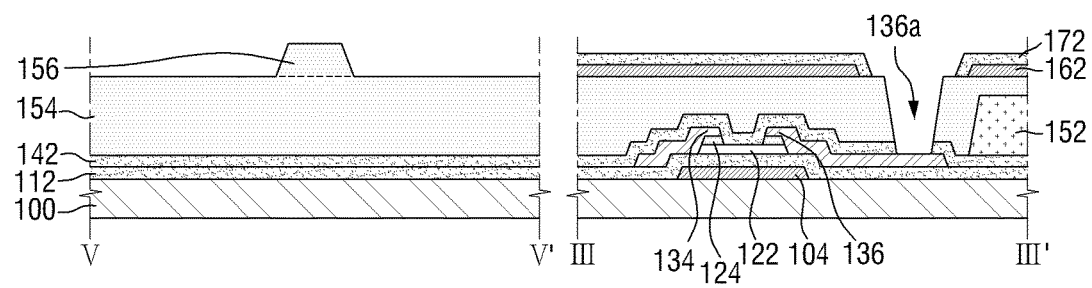

Subsequently, referring to FIG. 20, a second passivation layer 172 may be provided or formed on the common electrode 162 and the organic layer 154. The second passivation layer 172 may include an opening via which the contact hole 136*a* is exposed. The second passivation layer 172 may be formed by performing a process of depositing an inorganic insulative material such as silicon nitride or silicon oxide on the common electrode 162 and the organic layer 154 and a process of patterning the deposited inorganic insulative material to expose the contact hole 136*a*.

Although the second passivation layer 172 is patterned and may not be disposed on the protruding portions 156 in the non-display area NDA in some embodiments, the invention is not limited thereto. In an alternative exemplary embodiment, the second passivation layer 172 may be disposed on the protruding portions 156 in the non-display area NDA.

Figure 21:
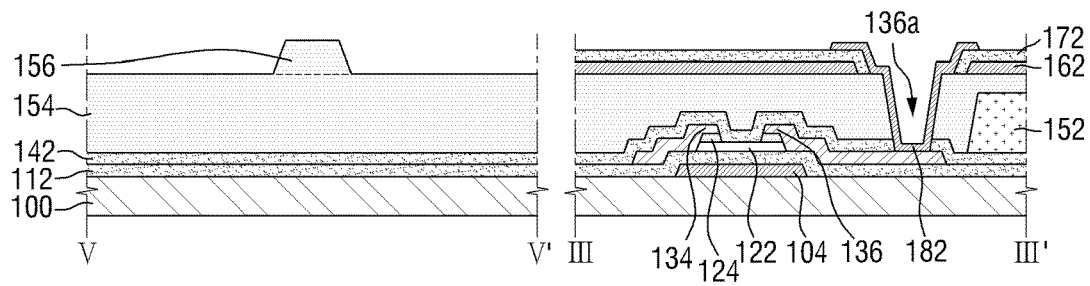

Subsequently, referring to FIG. 21, a pixel electrode 182 is provided or formed on the second passivation layer 172 and the organic layer 154. In such an embodiment, the pixel electrode 182 may be formed in a way such that the pixel electrode 182 comes in contact with at least a part of the drain electrode 136 exposed via the opening formed in the second passivation layer 172 and the contact hole 136*a* formed in the organic layer 154 and the first passivation layer 142. In such an embodiment, the pixel electrode 182 may be electrically coupled/connected to the drain electrode 136.

Subsequently, referring to FIG. 22, a light-blocking pattern 192 is provided or formed. The light-blocking pattern 192 may be disposed in an area where no electric filed is applied to liquid-crystal molecules included in the liquid-crystal layer 300, e.g., a thin-film transistor area or a non-pixel area (between pixels, gate line and data line areas). The light-blocking member 192 may include or be made of a black organic polymer material containing a black dye or pigment, or a metal (metal oxide) such as chrome, a chrome oxide, etc.

The light-blocking pattern 192 may include a step 156 protruding from its top surface disposed in the non-display area NDA by a predetermined height d2 due to the protruding portion 156 formed on the organic layer 154.

In some embodiments, the light-blocking pattern 192 may be formed by a stitch-shot process. In such embodiments, the mask for forming the part of the light-blocking pattern 192 in the non-display area NDA may be different from the mask for forming the part of the light-blocking pattern 192 in the display area DA. The mask for forming the part in the display area DA may be used continuously/repeatedly. However, such features are merely illustrative, and the method of forming the light-blocking pattern 192 is not limited thereto.

Subsequently, a column spacer 194 is provided or formed on the light-blocking pattern 192. In an exemplary embodiment, as shown in FIG. 22, the column spacer 194 and the light-blocking pattern 192 may be integrally formed as a single unitary and indivisible unit. In an exemplary embodiment, the column spacer 194 may be formed in the same process of forming the light-blocking pattern 192 as a single piece. In one exemplary embodiment, for example, the column spacer 194 and the light-blocking pattern 192 may be made of the same material and formed during the same patterning process via an exposure process using a halftone mask or a slit mask. However, such features are merely illustrative, and the invention is not limited thereto.

Figure 22:
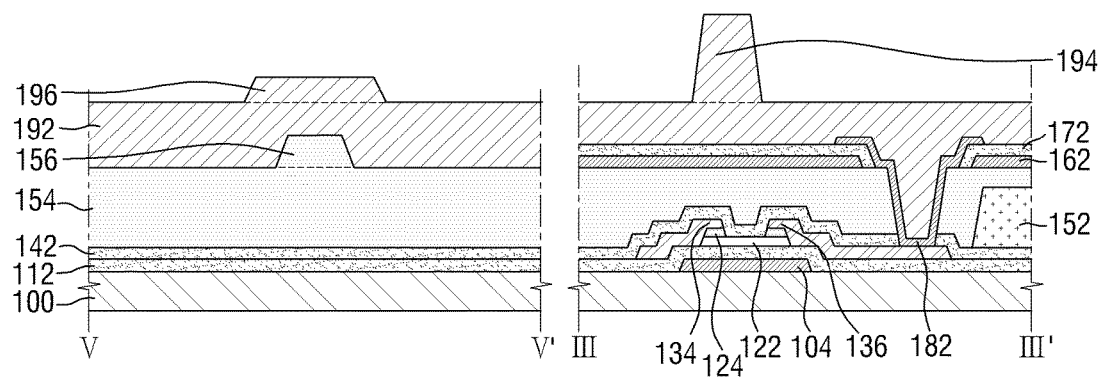
Figure 23:
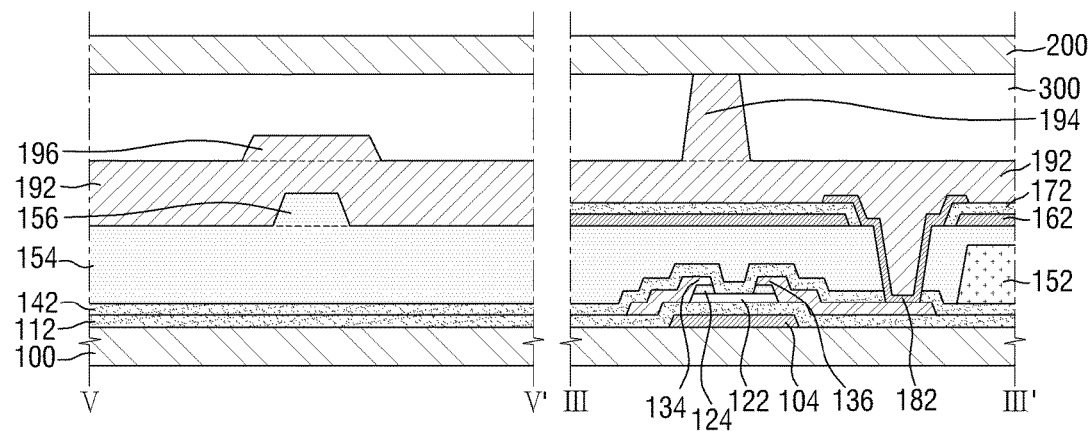

As shown in FIG. 22, the column spacer 194 may be formed above the thin-film transistor. However, such features are merely illustrative, and the location of the column spacer 194 is not limited thereto. As shown in FIG. 22, the height of the column spacer 194 may be higher than the height d2 of the step 196. Subsequently, referring to FIG. 23, liquid-crystal molecules having a positive or negative dielectric anisotropy may be applied onto the first substrate 100, thereby forming a liquid-crystal layer 300. Subsequently, the first substrate 100, on which the liquid-crystal layer 300 is formed, is coupled with a second substrate 200.

According to exemplary embodiments of the disclosure, the method of fabricating an LCD device includes forming the protruding portion 156 on the organic layer 154, so that the step 156 may be defined on the light-blocking pattern 192 naturally. As a result, even if the second substrate 200 is dented downwards during the process of coupling the first substrate 100 with the second substrate 200, the second substrate 200 may be supported by the step 156 on the light-blocking pattern 192 primarily. That is, even if the second substrate 200 is dented downwards, the gap between the first substrate 100 and the second substrate 200 may be effectively maintained by the step 156 on the light-blocking pattern 192. As a result, liquid crystals may spread properly throughout the non-display area NDA.

Although some exemplary embodiments of the disclosure have been disclosed for illustrative purposes, those skilled in the art would appreciate that various modifications and substitutions may be made without departing from the scope and spirit of the disclosure. For example, elements of the exemplary embodiment of the disclosure may be modified. Such modifications and substitutions are also construed as falling within the scope of the disclosure as defined by the appended claims.

While the invention has been particularly shown and described with reference to exemplary embodiments thereof, it will be understood by those of ordinary skill in the art that various changes in provide and detail may be made therein without departing from the spirit and scope of the invention as defined by the following claims. The exemplary embodiments should be considered in a descriptive sense only and not for purposes of limitation.

What is claimed is:

1. A liquid-crystal display device comprising:
    a first substrate;
    a second substrate disposed opposite to the first substrate, wherein a display area and a non-display area are defined in each of the first and second substrates;
    a liquid-crystal layer disposed between the first substrate and the second substrate;
    an organic layer comprising a protruding portion disposed in the non-display area of the first substrate; and
    a light-blocking pattern disposed on the organic layer and comprising a step protruding therefrom, wherein the step overlaps the protruding portion,
    wherein the step of the light-blocking pattern overlaps with the liquid-crystal layer in a plan view.

2. The liquid-crystal display device of claim 1, wherein a width of the step is larger than a width of the protruding portion.

3. The liquid-crystal display device of claim 1, wherein a height of the step is lower than a height of the protruding portion.

4. The liquid-crystal display device of claim 1, wherein
    the organic layer comprises a first protruding portion and a second protruding portion, and
    the first protruding portion is disposed more to an inside of the non-display area than the second protruding portion.

5. The liquid-crystal display device of claim 4, wherein the second protruding portion is spaced apart from the first protruding portion in a horizontal direction or a vertical direction.

6. The liquid-crystal display device of claim 4, wherein the second protruding portion is spaced apart from the first protruding portion in a diagonal direction with respect to a horizontal direction or a vertical direction.

7. The liquid-crystal display device of claim 1, wherein the protruding portion has a quadrangular shape when viewed from a top plan view.

8. The liquid-crystal display device of claim 1, wherein the protruding portion has a shape extending in a predetermined direction.

9. The liquid-crystal display device of claim 1, wherein
    the organic layer comprises a first protruding portion and a second protruding portion,
    the second protruding portion has a shape extending in a predetermined direction, and
    a width of the second protruding portion in the predetermined direction is larger than a width of the first protruding portion in the predetermined direction.

10. The liquid-crystal display device of claim 1, wherein
    the non-display area is disposed along an outer periphery of the display area and has a band shape when viewed from a top plan view, and
    the organic layer comprises a plurality of protruding portions, wherein the protruding portions are spaced apart from one another along the outer periphery of the display area.

11. The liquid-crystal display device of claim 1, wherein
    the display area has a quadrangular shape when viewed from a top plan view, and
    the non-display area has a quadrangular band shape when viewed from the top plan view.

12. The liquid-crystal display device of claim 1, further comprising:
    a column spacer disposed on the light-blocking pattern,
    wherein the light-blocking pattern and the column spacer are integrally formed as a single unitary and indivisible unit.

13. The liquid-crystal display device of claim 12, wherein a height of the step is lower than a height of the column spacer.

14. The liquid-crystal display device of claim 1, further comprising:
    a sealing member disposed in the non-display area and has a quadrangular band shape, wherein the step of the light-blocking pattern is positioned inside of the sealing member and overlaps with the liquid-crystal layer in the plan view.

\* \* \* \* \*